(12) United States Patent
Shirasaki (10) Patent No.: US 6,639,650 B2
(45) Date of Patent: Oct. 28, 2003

(54) LIGHT EXPOSURE METHOD, LIGHT EXPOSURE APPARATUS, PELLICLE AND METHOD FOR RELIEVING WARPAGE OF PELLICLE MEMBRANE

(75) Inventor: Toru Shirasaki, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/732,726

(22) Filed: Dec. 11, 2000

(65) Prior Publication Data

US 2001/0004508 A1 Jun. 21, 2001

(30) Foreign Application Priority Data

Dec. 21, 1999 (JP) .............................. 11-362926
Apr. 10, 2000 (JP) ........................ 2000-107647

(51) Int. Cl.[7] ........................... G03B 27/52; G03B 27/42
(52) U.S. Cl. ........................................... 355/30; 355/53
(58) Field of Search ............................... 428/34.9, 131, 428/538; 355/30, 39, 53

(56) References Cited

U.S. PATENT DOCUMENTS

| 4,861,402 | A | | 8/1989 | Gordon | |
|---|---|---|---|---|---|
| 4,875,076 | A | * | 10/1989 | Torigoe et al. | ............... 355/30 |
| 5,311,250 | A | * | 5/1994 | Suzuki et al. | ............... 156/556 |
| 5,422,704 | A | * | 6/1995 | Sego | ............. 355/30 |
| 5,576,125 | A | * | 11/1996 | Bih | ............. 156/108 |
| 5,689,327 | A | * | 11/1997 | Takeda | ..................... 219/121.6 |
| 5,772,817 | A | * | 6/1998 | Yen et al. | ..................... 156/108 |
| 5,968,661 | A | * | 10/1999 | Saito et al. | ................. 148/570 |
| 6,228,685 | B1 | * | 5/2001 | Beroz et al. | ................. 438/112 |

FOREIGN PATENT DOCUMENTS

| JP | 58-219023 | 12/1983 |
|---|---|---|
| JP | 63-27707 | 2/1988 |
| JP | 7-168345 | 7/1995 |

* cited by examiner

Primary Examiner—Rodney Fuller
Assistant Examiner—D. Ben Esplin
(74) Attorney, Agent, or Firm—Oliff & Berridge, PLC (57) ABSTRACT

Parallelism of a pellicle membrane surface of a pellicle 11 and a mask surface is adjusted and secured during light exposure. A light exposure apparatus is characterized in that it is provided with a mask holding part 8 and a pellicle holding part 9 or a pellicle supporting part. As another means, in a pellicle for lithography utilizing a glass plate as a pellicle membrane, the glass plate is formed beforehand to have warpage and adhered on a pellicle frame so that a convex surface of the glass plate should become an upper surface. A pellicle in which a glass plate is adhered to a preliminarily deformed pellicle frame on which the glass plate is to be placed, so that the glass plate should be given tension by stress obtained by resilience of the pellicle frame, and a pellicle in which a space surrounded by a pellicle comprising a glass plate and a pellicle frame and a photomask is decompressed. According to the present invention, resolution of lithography utilizing a pellicle is improved.

10 Claims, 4 Drawing Sheets

LIGHT EXPOSURE METHOD, LIGHT EXPOSURE APPARATUS, PELLICLE AND METHOD FOR RELIEVING WARPAGE OF PELLICLE MEMBRANE

BACKGROUND OF THE INVENTION

1. Field of the Invention

The present invention relates to a pellicle for lithography, that is, a pellicle for lithography used as a dust guard in the production of semiconductor devices such as LSI and VLSI or liquid crystal display panels, in particular, a pellicle for lithography used for laser beam light exposure used in light exposure which requires high resolution. Furthermore, the present invention relates to a light exposure method and light exposure apparatus for lithography utilizing a pellicle as well as a method for relieving warpage of a pellicle membrane.

2. Related Art

In the production of semiconductor devices such as LSI and VLSI or liquid crystal display panels, patterning step is conventionally performed by irradiating light on original substrates for semiconductor devices (semiconductor wafers) or original substrates for liquid crystal panels. In this case, dust particles adhered to a light exposure original (photomask) to be used may cause problems. That is, a transferred pattern may be deformed or edge lines of the pattern may be rugged without smoothness, because the dust particles may absorb or reflect the light. Therefore, dimension, appearance, quality and so forth of the pattern may be degraded, and thus performance and production yield of semiconductor devices, liquid crystal display panels and the like may be degraded.

For this reason, these operations are usually performed in a clean room. However, because it is difficult to keep a light exposure original always clean even in such a clean room, a pellicle well transmitting light is applied to a surface of the light exposure original for dust particle guard. That is, a pellicle is adhered to a mask (in the present invention, a light exposure original and a support substrate for the light exposure original are collectively referred to as "photomask" or "mask") in order to prevent adhesion of dust particles on the light exposure original used for the light irradiation.

In this case, if a pellicle is applied to a mask, dust particles do not adhere directly on the light exposure original, but on the pellicle membrane. Therefore, if the light is focused on the pattern of the light exposure original during the lithography process, the dust particles on the pellicle are defocused, and hence it provides an advantage that the presence of such dust particles does not influence on the pattern transfer.

Figure 1:
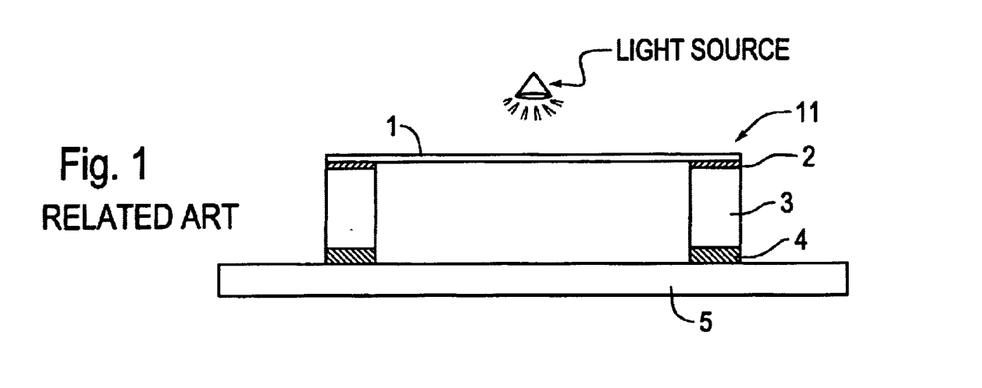
FIG. 1 is a schematic view showing an exemplary structure of a conventional pellicle adhered to a photomask.

As shown in FIG. 1, such a pellicle generally comprises a thin pellicle membrane 1, frame 3, membrane adhesive 2 that adheres the pellicle membrane 1 to the frame 3 and reticle adhesive 4 that adheres the pellicle 11 to a mask 5.

Such a pellicle 11 as shown in FIG. 1 has a structure that a transparent pellicle membrane 1 made of a material well transmitting light such as nitrocellulose, cellulose acetate and fluoropolymer is adhered to one surface of a pellicle frame made of aluminum, stainless steel, polyethylene or the like. In the structure, the pellicle is adhered to the pellicle frame by applying a solvent well dissolving the pellicle membrane 1 on one side surface of the pellicle frame 3 and dried in air (refer to Japanese Patent Laid-open Publication No. 58-219023), or with a membrane adhesive 2 such as acrylic resin, epoxy resin or fluoropolymer (refer to U.S. Pat. No. 4,861,402, Japanese Patent Publication No. 63-27707 and Japanese Patent Laid-open Publication No. 7-168345). Further, the pellicle has an adhesive layer (reticle adhesive) 4 comprising a polybutene resin, polyvinyl acetate resin, acrylate resin, silicone resin or the like and a release layer (separator, not shown) that protects the adhesive layer, which are adhered on the other side. As the pellicle membrane 1, a pellicle thick plate 7 (FIG. 5) such as a glass thick plate may be used. At the time of lithography, the pellicle 11 is adhered beforehand to a mask 5, before it is mounted on a light exposure apparatus. This adhesion to the mask 5 is attained by peeling the release layer and pressing the pellicle 11 to the mask 5 by applying a load. Therefore, the adhesive layer 4 of the pellicle 11 must have a certain thickness and elasticity.

The mask 5 adhered with the pellicle 11 is held and transferred by a mask holding part 8 (FIG. 2) of a light exposure apparatus, and then exposed to light at a predetermined position on the light exposure apparatus.

As for the adhesion of a conventional pellicle 11 and mask 5, there may be a case where a surface of pellicle membrane 1 (henceforth referred to as "pellicle membrane surface") is not parallel to a surface of a light exposure original of mask 5 (henceforth referred to as "mask surface").

As the cause of the above phenomenon, there can be mentioned uneven thickness of the adhesive layer provided on the lower surface of the frame 3, uneven pressing upon adhesion, dimensional error in processing of the frame 3 itself and so forth.

If the pellicle membrane surface and the mask surface are not parallel, light passing through the pellicle is distorted and such distortion is transferred on the light-exposed original to be irradiated with the light. Therefore, distortion of circuit pattern is caused on the light-exposed original. This distortion causes a deviation of the pattern line width of the circuit pattern on the light-exposed original, and leads to decrease of yield. Under the recent situation that a wavelength of the light to be used becomes shorter and is shifted to ultraviolet light due to use of finer mask pattern, it becomes increasingly important to secure the parallelism of the pellicle membrane surface and the mask surface.

Further, when a thick plate composed of glass or the like is used as a pellicle thick membrane 7, since it is a thick plate, the interference effect by a thin membrane is eliminated and the reflection at the surface of the pellicle thick plate becomes strong. Moreover, since the pellicle thick plate optically serves as a lens, it becomes more important to secure parallelism of the pellicle membrane surface and the mask surface.

However, in conventional light exposure apparatuses, no attention has been paid at all for adjustment of the parallelism between the pellicle membrane surface and the mask surface.

Moreover, as described above, the resolution of lithography has gradually become higher in recent years, and to realize such resolution, light of a shorter wavelength has gradually come to be used as a light source. Specifically, ultraviolet lights (g-line with wavelength of 436 nm and i-line with wavelength of 365 nm) are currently replaced with far-ultraviolet lights (KrF excimer laser, wavelength of 248 nm), and vacuum ultraviolet lights (ArF excimer laser, wavelength of 193 nm) are ready to be put into practical use in near future. Furthermore, in the lithography using $F_2$ (fluorine) excimer laser (158 nm) in order to realize higher resolution, use of glass plates composed of an inorganic compound or the like as the pellicle membrane is examined.

As the inorganic compound that can be used as the pellicle membrane, substances showing high transmittance in the vacuum ultraviolet region can be used. Specifically, fluorine-doped quartz glass, magnesium fluoride, calcium fluoride, lithium fluoride, aluminum oxide and so forth can be mentioned, and vitreous transparent plates of these are used.

When these inorganic compounds are used as the pellicle membrane, the membrane is desired to have a thickness of 0.1 mm or more in view of strength. However, in such a case, there may be caused a phenomenon that the inorganic compound plate (hereafter it may be referred to as "glass plate") may be deflected by its own weight. This deflection may cause deviation of light path for light exposure at the pellicle membrane surface, and thus adversely affect the light exposure.

SUMMARY OF THE INVENTION

The present invention was accomplished in order to solve these problems, and its object is to improve resolution in the lithography using a pellicle. That is, one of the specific objects of the present invention is to enable adjustment of parallelism between a pellicle membrane surface and a mask surface upon the light exposure in the lithography utilizing a pellicle.

Furthermore, another specific object of the present invention is to provide a pellicle of high performance comprising a pellicle membrane and a pellicle frame, which does not cause deviation of light path for light exposure due to deflection of a glass plate caused by its own weight and thus does not adversely affect resolution of the lithography, when a glass plate is used as the pellicle membrane in order to use vacuum ultraviolet light of a short wavelength as a light source.

In order to achieve the aforementioned objects, according to the first aspect of the present invention, a method for light exposure of the present invention in lithography using a pellicle is characterized in that parallelism of a pellicle membrane surface of a pellicle and a mask surface is adjusted and secured during light exposure.

The light exposure apparatus of the present invention is characterized in that the light exposure apparatus is provided with a mask holding part and a pellicle holding part or a pellicle supporting part. This pellicle supporting part has a structure that can adjust the pellicle membrane surface to be parallel to the mask surface.

Further, in the pellicle of the present invention used for the lithography, the pellicle membrane consisting of a thick plate can protrude outward from the frame, and the protruding portion may be used as a part to be held that is held by the aforementioned pellicle holding part.

Further, according to the second aspect of the present invention, there is provided a pellicle for lithography, wherein a glass plate is used as a pellicle membrane of the pellicle for lithography, and the glass plate is formed beforehand to have warpage and adhered on a pellicle frame so that a convex surface of the glass plate should become an upper surface.

In the aforementioned structure, the convex warpage is relieved by the own weight of the glass plate, and thus the pellicle can be a pellicle having an extremely flat pellicle membrane without deflection. Therefore, it enables extremely accurate and precise lithography using vacuum ultraviolet light without causing deviation of light path for light exposure during the lithography.

The present invention further provides a pellicle for lithography, wherein a glass plate is used as a pellicle membrane of the pellicle for lithography, and the glass plate is adhered to a preliminarily deformed pellicle frame on which the glass plate is to be placed, so that the glass plate should be given tension by stress obtained by resilience of the pellicle frame.

If a pellicle is constructed as described above, by deforming the pellicle frame inward beforehand, adhering the pellicle membrane on it, and then releasing the distortion of the frame, tension is given to the pellicle membrane by the resilience of the pellicle frame, and thus a pellicle having a the pellicle membrane of excellent flatness can be realized.

The present invention also provides a pellicle for lithography, wherein a glass plate is used as a pellicle membrane of the pellicle for lithography, and a space surrounded by the pellicle comprising the glass plate and a pellicle frame and a photomask is decompressed.

If a space surrounded by the pellicle and the photomask is decompressed when the pellicle is adhered on the photomask as described above, and the pellicle is disposed so that it should be under the photomask, the pellicle can be a pellicle of which warpage due to its own weight is relieved because the pellicle membrane is given a force from below by atmospheric pressure.

Further, the present invention also provides, as a method for relieving warpage of a pellicle membrane of the pellicle for lithography according to the present invention, a method for relieving warpage of a pellicle membrane of a pellicle for lithography utilizing a glass plate as the pellicle membrane, which comprises making the glass plate as the pellicle membrane to have warpage, and adhering the glass plate having warpage to a pellicle frame with an adhesive so that a convex surface of the glass plate should become an upper surface to relieve downward warpage of the glass plate due to its own weight.

In such a manner, the downward warpage of the glass plate due to its own weight is relieved by the convex shape of the glass plate, and thus an extremely flat pellicle membrane with no deflection can be formed. Therefore, deviation of light path for light exposure during the lithography can be obviated, and extremely accurate and precise lithography can be performed.

The present invention also provides, as a method for relieving warpage of a pellicle membrane of the pellicle for lithography according to the present invention, a method for relieving warpage of a pellicle membrane of a pellicle for lithography utilizing a glass plate as the pellicle membrane, which comprises adhering the glass plate as the pellicle membrane with an adhesive to a preliminarily deformed pellicle frame on which the glass plate is to be placed, so that the glass plate should be given tension by stress obtained by resilience of the pellicle frame to relieve downward warpage of the glass plate due to its own weight.

In this method, for example, by deforming the pellicle frame inward beforehand, adhering the pellicle membrane on it, and then releasing the distortion of the frame, tension is given to the pellicle membrane by the resilience of the pellicle frame, and thus the downward warpage of the glass plate caused by its own weight can be relieved. Therefore, an extremely flat pellicle membrane can be formed.

In this case, the method for the deformation and the restoration of the pellicle frame may be a mechanical method or a method utilizing a temperature difference.

Extremely effective are a method of forming inward distortion for each side of the pellicle frame as the mechanical method, a method of shrinking the pellicle frame by cooling it as the method utilizing a temperature difference, and so forth.

The present invention further provides, as a method for relieving warpage of a pellicle membrane of the pellicle for lithography according to the present invention, a method for relieving warpage of a pellicle membrane of a pellicle for lithography utilizing a glass plate as the pellicle membrane, which comprises adhering a pellicle comprising the glass plate as the pellicle membrane and a pellicle frame to a photomask under reduced pressure, and disposing the photomask adhered with the pellicle in such a manner that the pellicle should be under the photomask when they are used, so that downward warpage of the glass plate due to its own weight should be relieved.

If a space surrounded by the pellicle and the photomask is decompressed when the pellicle is adhered to the photomask, and the pellicle is disposed so that it should be under the photomask as described above, warpage of the pellicle membrane due to its own weight is relieved because it is given a force from below by atmospheric pressure, and thus a pellicle having an extremely flat pellicle membrane can be formed.

According to the first aspect of the present invention, the parallelism of the pellicle membrane surface with respect to the mask surface is adjusted and secured by holding the mask with a mask holding part of a light exposure apparatus and holding the pellicle with a pellicle holding part during light exposure. Thus, the parallelism of pellicle membrane surface with respect to the mask surface is enhanced, and light exposure of high quality becomes possible.

Further, according to the second aspect of the present invention, as for a glass plate used as a pellicle membrane when a light source of a shorter wavelength is used, warpage of the glass plate due to its own weight can be relieved. Therefore, there can be provided a highly flat pellicle comprising a pellicle membrane and a pellicle frame of high performance, which does not cause deviation of light path for light exposure due to deflection of a glass plate caused by its own weight, and thus which does not adversely affect the resolution of lithography.

PREFERRED EMBODIMENTS OF THE INVENTION

Embodiments of the present invention will be explained hereafter. However, the present invention is not limited to these.

As described above, conventional light exposure apparatuses are provided only with a mask holding part 8 (FIG. 2) having a function for holding a mask 5 by grasping the mask 5 by the both sides, and do not have any function for holding a pellicle.

As a result of researches of the inventor of the present invention, it was found that the aforementioned object can be achieved by newly providing a pellicle holding part 9 (FIG. 2) for holding a pellicle on a light exposure apparatus, in addition to a mask holding part 8 provided on conventional light exposure apparatuses, in order to make a pellicle membrane surface parallel to a mask surface during the light exposure in lithography utilizing a pellicle, or by providing a pellicle supporting part 10 (FIG. 4) to adjust and secure parallelism of the pellicle membrane surface and the mask surface. Thus, the first aspect of the present invention was accomplished.

As a result of further researches of the inventor of the present invention, it was found that the phenomenon that warpage of a glass plate as the pellicle membrane is caused by its own weight could be relieved by a specific warped shape of the glass plate, disposition state of the glass plate, resilience of the pellicle frame obtained when it was deformed or the like, and thus the flatness of the pellicle membrane could be improved. Then, the inventor determined various conditions therefor and accomplished the second aspect of the present invention.

The first aspect of the present invention will be explained first. The method according to the first aspect of the present invention is characterized in that parallelism of a pellicle membrane surface and a mask surface is adjusted during light exposure by utilizing elasticity of an adhesive layer 4 (reticle adhesive layer) that is used for adhesion of the pellicle and the mask 5.

Since the flat plate-like mask 5 is held by the mask holding part 8, the horizontality of the mask surface can be determined by controlling the mask holding part 8. If the pellicle can be held by the pellicle holding part 9 while maintaining the horizontality of the pellicle membrane surface, both of the mask surface and the pellicle membrane surface become horizontal, and therefore the both can be parallel to each other. The variance produced between the plane of the mask surface and the plane of the pellicle membrane when the parallelism is adjusted and secured is absorbed by the elasticity of the adhesive layer 4 used for the adhesion of the pellicle and the mask 5.

Since the flatness of the surface of the frame 3 for pellicles to which the pellicle membrane 1 is adhered is conventionally maintained in a sufficient degree, the flatness of the pellicle membrane 1 adhered to the frame 3 is secured. Therefore, if the pellicle is held by the pellicle holding part 9 so that the plane of the pellicle membrane surface should be horizontal, the pellicle membrane surface should become parallel to the mask surface.

Figure 2:
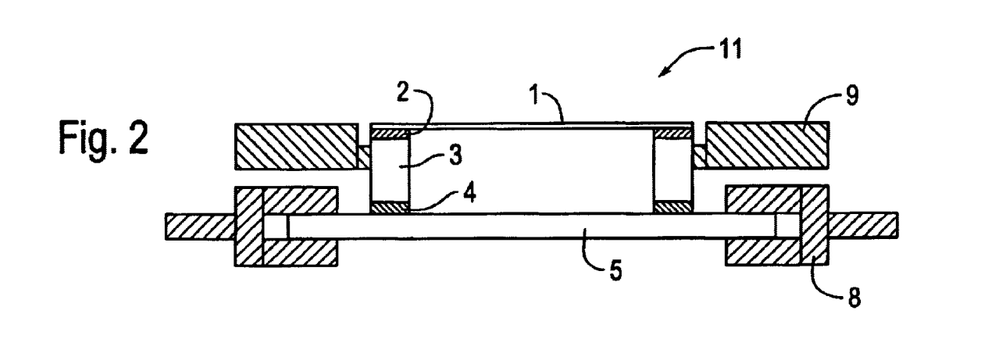
FIG. 2 is an explanatory view showing the embodiment of Example 1 according to the present invention.

If a frame 3 is finished so that a side of the frame and the adhesion surface of the pellicle membrane 1 should become perpendicular to each other, the pellicle membrane surface can be horizontally held by preliminarily adjusting the posture of the pellicle holding part 9 for holding the side of the frame 3 and holding the side of the frame 3 by the pellicle holding part 9 as shown in FIG. 2.

By using a mechanism (not shown) that can change the angle of a gripping part of the pellicle holding part 9 so that the pellicle membrane surface should become horizontal, the pellicle 11 can be held so that the pellicle membrane surface should be horizontal using the plane of the pellicle membrane surface as a standard.

Figure 3:
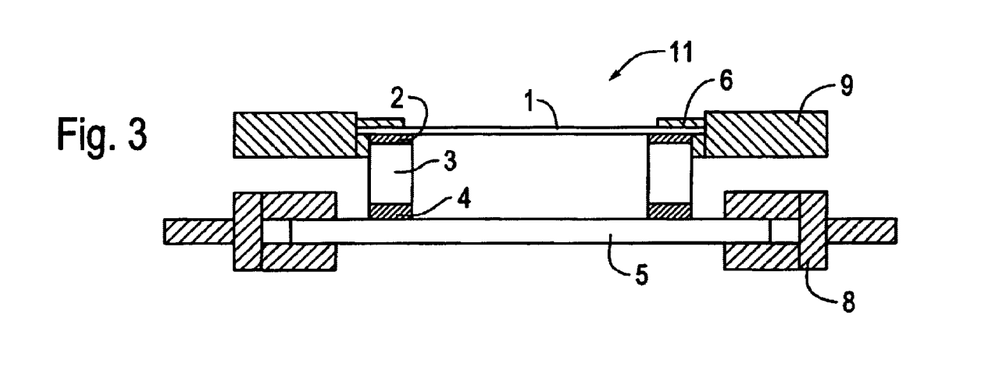
FIG. 3 is an explanatory view showing the embodiment of Example 2 according to the present invention.

For using the plane of the pellicle membrane surface as a standard, an extruding part 6 can also be provided on the side of the pellicle holding part 9 (FIG. 3).

When any of the aforementioned approaches is used, the pellicle must have a part to be held that can be held by the pellicle holding part 9 of the light exposure apparatus, and the pellicle surface can be made parallel to the mask surface by adjusting and securing the part to be held in such a manner that it should be held by the pellicle holding part 9 of the light exposure apparatus so that it should become parallel to the mask surface.

Figure 5:
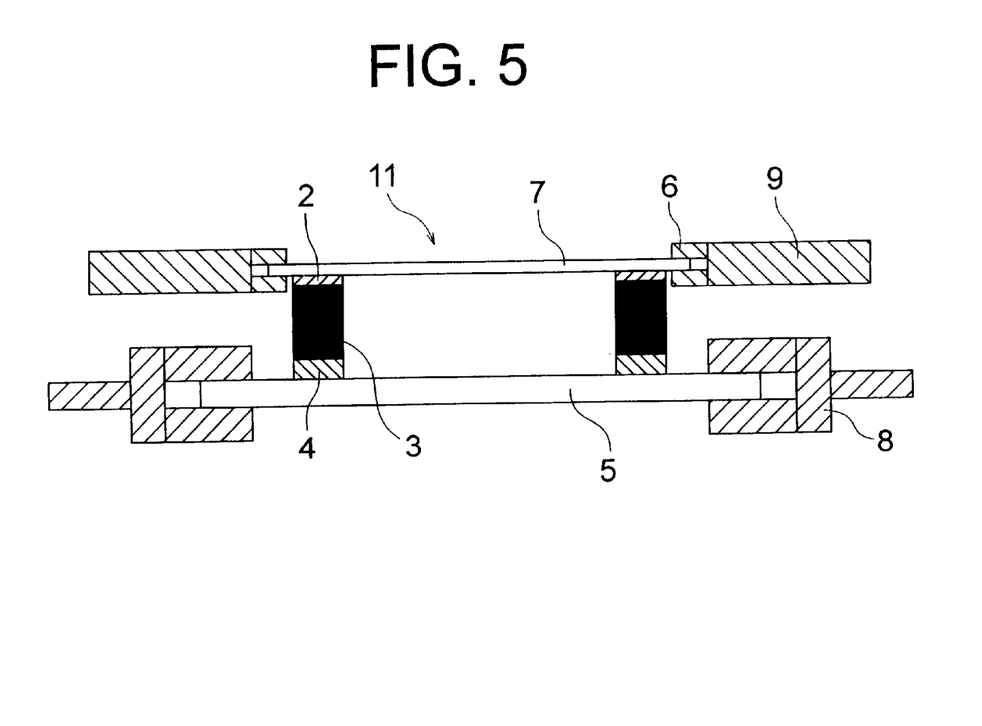
FIG. 5 is an explanatory view showing the embodiment of Example 4 according to the present invention.

As the part to be held of the pellicle 11, the frame 3 of the pellicle 11 can be used. When a thick plate such as a glass thick plate 7 is used, the thick plate can protrude to the outside of the frame, and the protruding part of the pellicle membrane (plate) can be used as the part to be held (FIG. 5).

It is also possible to provide an extruding part 6 parallel to the pellicle membrane 1 on the pellicle membrane side of the frame, and utilize the extruding part 6 as a standard of the pellicle membrane plane (FIG. 3).

Further, as a variation of the pellicle holding part 9, a pellicle supporting part 10 can also provided on the mask holding part 8 of the light exposure apparatus (FIG. 4), and parallelism of the pellicle membrane surface and the mask surface can be improved by holding the mask 5 by the mask holding part 8 and further pressing or separating the pellicle 11 against the mask 5 by the pellicle supporting part 10.

The adjustment of the parallelism between the pellicle membrane surface and the mask surface explained herein becomes possible if the adhesive layer has elasticity. As the adhesive layer, an adhesive with relatively small elasticity, for example, a silicone adhesive, is preferably used.

In the embodiments shown in FIGS. 2 to 5, the pellicle membrane 1 is held by the light exposure apparatus according to the present invention in a state that the pellicle membrane locates above the mask 5. However, the positional relationship of the pellicle membrane 1 and the mask 5 is not limited to this. That is, the pellicle membrane 1 may be held so that it should locate under the mask 5 as will be explained hereinafter in connection with the second aspect of the present invention.

The second aspect of the present invention will be explained hereinafter. As a method for relieving the warpage of the glass plate as the pellicle membrane caused by its own weight, the shape of the glass plate in use can be flattened by disposing the glass plate so that its convex surface should become an upper surface to compensate the downward warpage due to the own weight.

As another method for relieving the warpage caused by the own weight, the glass plate can be adhered to a preliminarily deformed pellicle frame for supporting the glass plate so that the glass plate should be given tension by stress obtained by resilience of the pellicle frame to relieve the warpage due to the own weight.

As a further method for relieving the warpage caused by the own weight, a space surrounded by the pellicle and the photomask can be decompressed and the pellicle can be disposed under the photomask so that the upward force by the atmospheric pressure and the downward warpage due to the own weight should be compensated by each other to flatten the shape of the glass plate in use.

Hereafter, these methods will be explained in more detail.

When a vitreous plate of an inorganic compound is used for a pellicle membrane, since an inorganic compound is generally inflexible, it is desirable that the plate should have a thickness of 0.1 mm or more in view of strength. In this case, the glass plate warps downward by the weight of the glass plate itself. Degree of this warpage depends on the characteristics of the inorganic compound, size of the glass plate and so forth. In particular, it tends to be larger when the plate thickness becomes thinner. This deflection causes deviation of light path for light exposure, and thus adversely affects the resolution of lithography.

Figure 6:
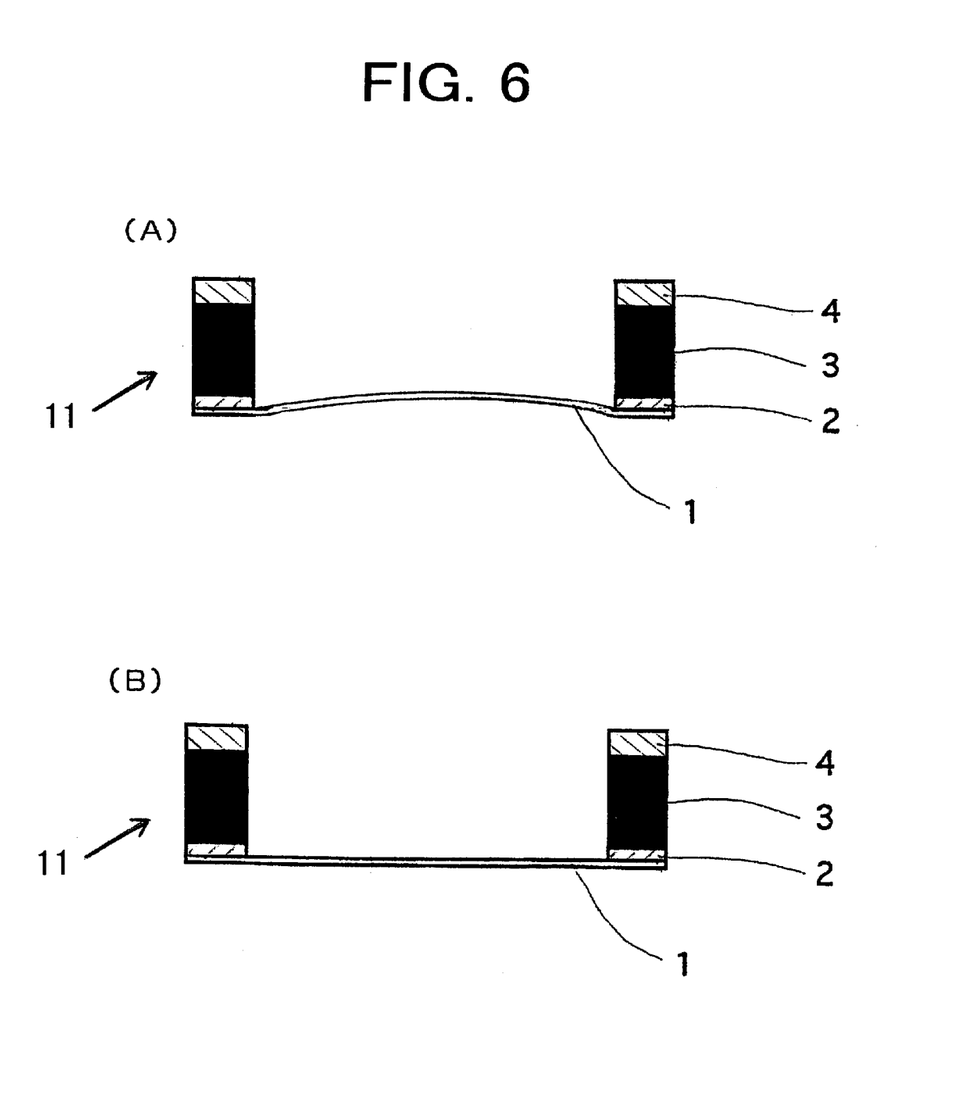
FIG. 6 comprises conceptual views showing the pellicle of the present invention for the time points of (A) adhesion of a pellicle membrane to a frame and (B) use.
Figure 7A:
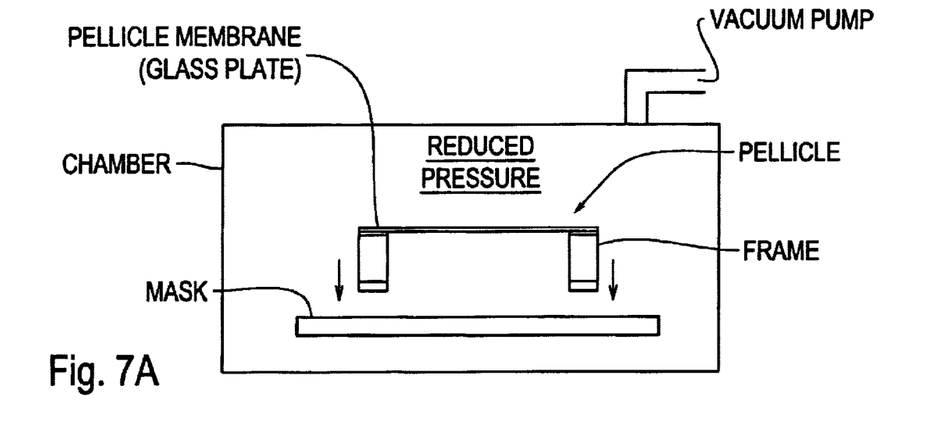
FIG. 7 comprises conceptual views showing that a pellicle is adhered to a photomask under reduced pressure (A), they are disposed so that the pellicle is under the photomask under atmospheric pressure (B), and the warpage of the pellicle membrane due to its own weight is relieved (C).
Figure 7B:
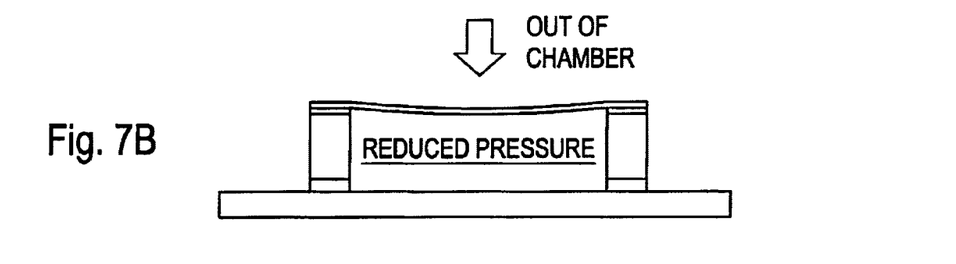
Figure 7C:
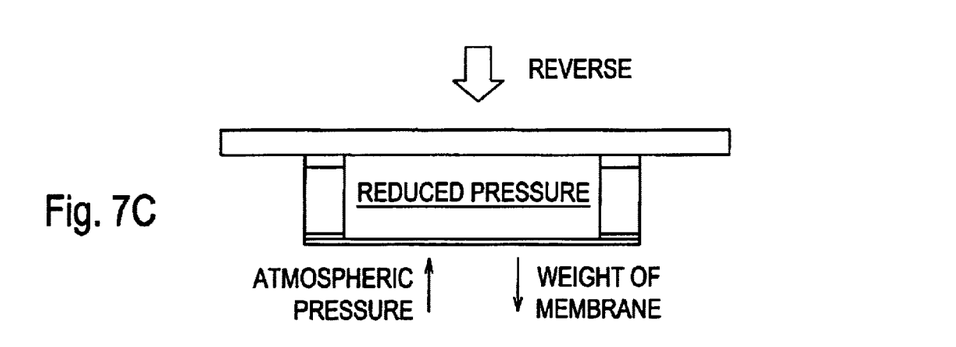

As the first method for relieving the deflection caused by the own weight, there can be mentioned the method of disposing the glass plate so that its convex surface should become an upper surface as shown in FIG. 6 to compensate the downward warpage due to the own weight.

That is, when the glass plate is polished, warpage is intentionally formed on the glass plate. In this case, the polishing is performed so that the glass plate should have a convex on one side and a concave on the other side. By adhering the pellicle to the pellicle frame so that the convex surface should be directed to the direction opposite to the direction of the gravity as shown in FIG. 6(A), warpage due to the gravity and the warpage formed by polishing of the glass plate are compensated by each other during use as shown in FIG. 6(B), and thus a pellicle membrane without warpage or a pellicle membrane of which warpage is relieved can be obtained. In this case, since the warpage due to the own weight becomes larger as the plate thickness becomes thinner, it is preferable to form a larger warpage in the glass plate during the polishing for such a case.

As the second method for relieving the warpage caused by the own weight, there can be mentioned the method comprising adhering the glass plate to a preliminarily deformed pellicle frame so that the glass plate should be given tension by stress obtained by resilience of the pellicle frame to relieve the warpage due to the own weight.

That is, as for the pellicle comprising a pellicle membrane and a pellicle frame holding the pellicle membrane, a preliminarily deflected pellicle frame is adhered to the pellicle membrane composed of an inorganic compound. After the adhesion, tension is imparted to the pellicle membrane by releasing the distortion of the pellicle frame, and thus the warpage due to the own weight can be relieved.

As for the method for deforming the pellicle frame, it can be mechanically deformed. Alternatively, it can also be deformed by temperature difference; in particular, it can be shrunk by cooling. In order to give tension for pulling a peripheral portion of the pellicle membrane, the pellicle frame is distorted inward beforehand and adhered to the pellicle membrane. Then, when the distortion is released, tension is given to the pellicle membrane by the pellicle frame. The adhesive used for the adhesion of the pellicle frame and the pellicle membrane is preferably has high hardness in order to suppress its stress absorption as small as possible.

As the third method for relieving the warpage caused by the own weight, there can be mentioned the method comprising decompressing a space surrounded by a pellicle and a photomask to relieve the downward warpage due to the own weight.

The pellicle is generally disposed under the photomask. While the pellicle membrane warps downwardly due to the gravity, the pellicle membrane is lifted thanks to the decompression (reduced pressure) of the space surrounded by the pellicle and the photomask, and hence the deformation due to the own weight can be eliminated or relieved.

Since the warpage of the pellicle membrane due to its own weight and the upward warpage due to the decompression depend on the thickness of the membrane, kind of the material and so forth, the pellicle in use can be highly flattened by changing the decompression degree according to the thickness of the glass plate and so forth. Incidentally, since the photomask is generally thicker than the pellicle membrane, warpage of the photomask due to the decompression can be ignored.

The glass plate that can be used in the present invention as the pellicle membrane is not particularly limited. As for the inorganic compound, for example, those showing high transmittance for the vacuum ultraviolet region can be used. Specifically, there can be mentioned magnesium fluoride, calcium fluoride, lithium fluoride, fluorine doped quartz glass, aluminum oxide and so forth. Since these compounds are brittle, the thickness of the pellicle membrane must be 0.01 mm or more, preferably 0.1 mm or more, in order to use them as the pellicle membrane. On the other hand, if the thickness becomes too large, the transmittance will be lowered and the weight will increase. Therefore, the thickness is preferably 10 mm or less, more preferably 5 mm or less.

EXAMPLES

Hereafter, the present invention will be explained more specifically with reference to the following examples of the present invention and a comparative example. However, the present invention is not limited by these.

Example 1

A pellicle having a thin membrane composed of a fluorocarbon resin as a pellicle membrane and an adhesive layer 4 composed of a silicone resin with a thickness of 0.5 mm is placed on a mask 5, and load is applied to an upper surface of a frame 3 to adhere the pellicle to the mask 5.

This mask 5 is introduced to a light exposure position by using the light exposure apparatus (essential part) shown in FIG. 2 as an explanatory view of an embodiment of the present invention. The mask 5 is transferred by a mask holding part 8 of the light exposure apparatus to a predetermined position and subjected to light exposure. Sides of the frame 3, which are confirmed to be perpendicular to the surface to be adhered with the pellicle, are held by a pellicle holding part 9 provided on the light exposure apparatus, and thus parallelism of a pellicle membrane surface and a mask surface is adjusted and secured. By this adjustment, the parallelism of the pellicle membrane surface and the mask surface was enhanced, and it thus became possible to perform the light exposure with high quality.

Example 2

A pellicle similar to that used in Example 1 is placed on a mask 5, and load is applied to an upper surface of a frame 3 to adhere the pellicle to the mask 5.

This mask 5 is introduced to a light exposure position by using the light exposure apparatus (essential part) shown in FIG. 3 as an explanatory view of an embodiment of the present invention. The mask 5 is transferred by a mask holding part 8 of the light exposure apparatus to a predetermined position and subjected to light exposure. The frame 3 is held by a pellicle holding part 9 of the light exposure apparatus. The pellicle holding part 9 has an extruding portion 6 that is contacted with the upper surface of the frame 3. The pellicle holding part 9 rotates so that the extruding portion 6 should be brought into contact with the end surface of the frame 3 to which the pellicle membrane surface is adhered, and then the pellicle holding part 9 grips the frame.

Then, the direction of the pellicle holding part 9 is changed to a preset one to correct the parallelism of the pellicle holding part 9 with respect to the mask holding part 8, and thus the parallelism of the pellicle membrane surface and the mask surface is adjusted and secured (rotation mechanism and so forth are not shown in the figure, but any type of mechanism may be used). By this adjustment, the parallelism of the pellicle membrane surface and the mask surface was enhanced, and thus light exposure of high quality became possible.

Although detailed explanation is omitted in this example, even for a pellicle in which perpendicularity of the axial line of the frame and the end surface to be adhered with the pellicle membrane is not secured, the parallelism of the pellicle membrane surface and the mask surface can of course be adjusted and secured by utilizing a spherical seat or the like for the frame gripping mechanism of the pellicle holding part 9.

Example 3

A pellicle similar to that used in Example 1 is placed on a mask 5, and load is applied to an upper surface of a frame 3 to adhere the pellicle to the mask 5.

Figure 4:
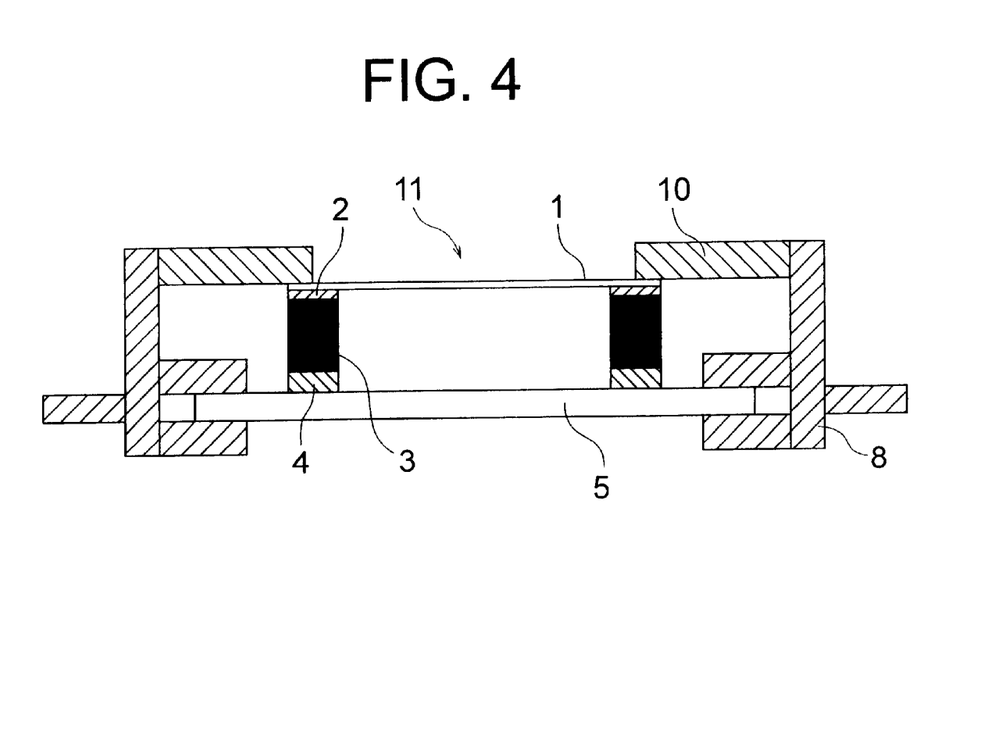
FIG. 4 is an explanatory view showing the embodiment of Example 3 according to the present invention.

This mask 5 is introduced to a light exposure position by using the light exposure apparatus (essential part) shown in FIG. 4 as an explanatory view of an embodiment of the present invention. The mask 5 is transferred by a mask holding part 8 of the light exposure apparatus to a predetermined position and subjected to light exposure. In this case, the pellicle 11 is uniformly and precisely pressed against the mask 5 by a pellicle supporting part 10 provided on the mask holding part 8. The parallelism of the pellicle membrane surface with respect to the mask surface is adjusted and secured by this pressing. By this adjustment, the parallelism of the pellicle membrane surface and the mask surface was enhanced, and thus light exposure of high quality became possible.

Example 4

A pellicle having a pellicle thick plate 7 made of glass as a pellicle membrane is placed on a mask 5, and load is applied to an upper surface of a frame 3 to adhere the pellicle to the mask 5.

This mask 5 is introduced to a light exposure position by using the light exposure apparatus (essential part) shown in FIG. 5 as an explanatory view of an embodiment of the present invention. The mask 5 is transferred by a mask holding part 8 of the light exposure apparatus to a predetermined position and subjected to light exposure. In this case, a portion of the thick plate protruding outward is held by the pellicle holding part 9 of the light exposure apparatus, and thus the parallelism of the pellicle membrane surface and the mask surface is adjusted and secured. By this adjustment, the parallelism of the pellicle 11 and the mask 5 was enhanced, and thus light exposure of high quality became possible.

Example 5

Quartz glass doped with fluorine was used as the inorganic compound for pellicle membrane. The glass was polished into a glass plate having a length of 140 mm, width of 120 mm and thickness of 1 mm. In this polishing step, a convex surface was formed on one side of the glass plate, and a concave surface was formed on the other side. The degree of the warpage at the center portion was 4 $\mu$m.

A pellicle frame made of aluminum was adhered to the convex surface of the glass plate to complete a pellicle. Then, this pellicle was adhered to a photomask. When they were disposed so that the pellicle should be under the photomask, the convex warpage of the glass plate was compensated by the downward warpage due to the own weight, and the degree of warpage at the center portion was reduced to 0.3 µm.

Example 6

Quartz glass doped with fluorine was used as the inorganic compound for pellicle membrane. The glass was polished into a glass plate having a length of 140 mm, width of 120 mm and thickness of 1 mm. In this polishing step, warpage was formed with a degree of 0.1 µm at the center portion of the glass plate.

A pellicle frame made of aluminum was adhered to the glass plate doped with fluorine, while all of the four sides of the pellicle frame were mechanically deflected inward by 3 mm. Then, the distortion of the pellicle frame was released to complete a pellicle.

Then, this pellicle was adhered to a photomask. When they were disposed so that the pellicle should be under the photomask, the warpage of the glass plate due to its own weight was relieved by tension given to the glass plate by the outward resilience force exerted by each side of the pellicle frame. The degree of warpage at the center portion was 1.0 µm.

Example 7

Quartz glass doped with fluorine was used as the inorganic compound for pellicle membrane. The glass was polished into a glass plate having a length of 140 mm, width of 120 mm and thickness of 1 mm. In this polishing step, warpage was formed with a degree of 0.1 µm at the center portion of the glass plate.

A pellicle frame made of aluminum was deformed by shrinkage through cooling to −80° C. In that state, it was adhered to the aforementioned fluorine doped quartz glass plate. Then, the temperature of the pellicle frame was returned to room temperature (25° C.) to complete a pellicle.

Then, this pellicle was adhered to a photomask. When they were disposed so that the pellicle should be under the photomask, the warpage of the glass plate due to its own weight was relieved by tension given to the pellicle membrane by the outward swelling force from each side of the pellicle frame. The degree of warpage at the center portion was reduced to 1.2 µm.

Example 8

Quartz glass doped with fluorine was used as the inorganic compound for pellicle membrane. The glass was polished into a glass plate having a length of 140 mm, width of 120 mm and thickness of 1 mm. In this polishing step, warpage was formed with a degree of 0.1 µm at the center portion of the glass plate. A pellicle frame made of aluminum was adhered to the plate to complete a pellicle.

Then, this pellicle was adhered to a photomask under a reduced pressure of $5.0 \times 10^4$ Pa, and they were disposed so that the pellicle should be under the photomask under atmospheric pressure ($1.0 \times 10^5$ Pa). Since the space surrounded by the pellicle and the photomask was decompressed and the pellicle membrane received a force from below by atmospheric pressure, the warpage of the glass plate due to its own weight was relieved and the degree of warpage at the center portion was reduced to 1.0 µm.

Comparative Example

Quartz glass doped with fluorine was used as the inorganic compound for pellicle membrane. The glass was polished into a glass plate having a length of 140 mm, width of 120 mm and thickness of 1 mm. In this polishing step, warpage was formed with a degree of 0.1 µm at the center portion of the plate.

A pellicle frame made of aluminum was adhered to the glass plate to complete a pellicle. Then, this pellicle was adhered to a photomask. When they were disposed so that the pellicle should be under the photomask, the downward warpage of the glass plate due to its own weight became large, i.e., 4.0 µm.

The results are summarized in Table 1.

TABLE 1

| Example No. | Warpage at center portion (µm) |
| --- | --- |
| Example 5 | 0.3 |
| Example 6 | 1.0 |
| Example 7 | 1.2 |
| Example 8 | 1.0 |
| Comparative Example | 4.0 |

As shown by the results mentioned above, it can be understood that the downward warpage of the glass plate as the pellicle membrane due to its own weight can surely be relieved by the present invention.

The present invention is not limited to the embodiments described above. The above-described embodiments are mere examples, and those having the substantially same structure as that described in the appended claims and providing the similar functions and advantages are included in the scope of the present invention.

What is claimed is:

1. A method for light exposure in lithography using a pellicle, wherein parallelism of a pellicle membrane surface of a pellicle and a mask surface is adjusted and secured during light exposure.

2. A light exposure apparatus used for lithography using a pellicle, wherein the apparatus is provided with a mask holding part and a pellicle supporting part, and the pellicle supporting part has a structure that can adjust the pellicle membrane surface to be parallel to the mask surface.

3. A pellicle for lithography, wherein a glass plate is used as a pellicle membrane of the pellicle for lithography, and the glass plate is formed beforehand to have warpage and adhered on a pellicle frame so that a convex surface of the glass plate should become an upper surface.

4. A pellicle for lithography, wherein a glass plate is used as a pellicle membrane of the pellicle for lithography, and the glass plate is adhered to a preliminarily deformed pellicle frame on which the glass plate is to be placed, so that the glass plate is tensioned by stress obtained by resilience of the pellicle frame.

5. A pellicle for lithography, wherein a glass plate is used as a pellicle membrane of the pellicle for lithography, and a space surrounded by the pellicle comprising the glass plate and a pellicle frame and a photomask is decompressed.

6. A method for relieving warpage of a pellicle membrane of a pellicle for lithography utilizing a glass plate as the pellicle membrane, which comprises making the glass plate as the pellicle membrane to have warpage, and adhering the glass plate having warpage to a pellicle frame with an adhesive so that a convex surface of the glass plate should become an upper surface to relieve downward warpage of the glass plate due to its own weight.

7. A method for relieving warpage of a pellicle membrane of a pellicle for lithography utilizing a glass plate as the pellicle membrane, which comprises adhering the glass plate as the pellicle membrane with an adhesive to a preliminarily deformed pellicle frame on which the glass plate is to be placed, so that the glass plate is tensioned by stress obtained by resilience of the pellicle frame to relieve downward warpage of the glass plate due to its own weight.

8. The method for relieving warpage of a pellicle membrane according to claim 7, wherein the method for the deformation and the restoration of the pellicle frame is a mechanical method or a method utilizing a temperature difference.

9. A method for relieving warpage of a pellicle membrane of a pellicle for lithography utilizing a glass plate as the pellicle membrane, which comprises adhering a pellicle comprising the glass plate as the pellicle membrane and a pellicle frame to a photomask under reduced pressure, and disposing the photomask adhered with the pellicle in such a manner that the pellicle should be under the photomask when they are used, so that downward warpage of the glass plate due to its own weight should be relieved.

10. The method for light exposure according to claim 1, wherein the parallelism of a pellicle membrane surface of a pellicle and a mask surface is adjusted and secured by horizontally holding a mask and holding a pellicle membrane or a frame of the pellicle while maintaining horizontality of the pellicle membrane surface.

* * * * *